Figure 1:
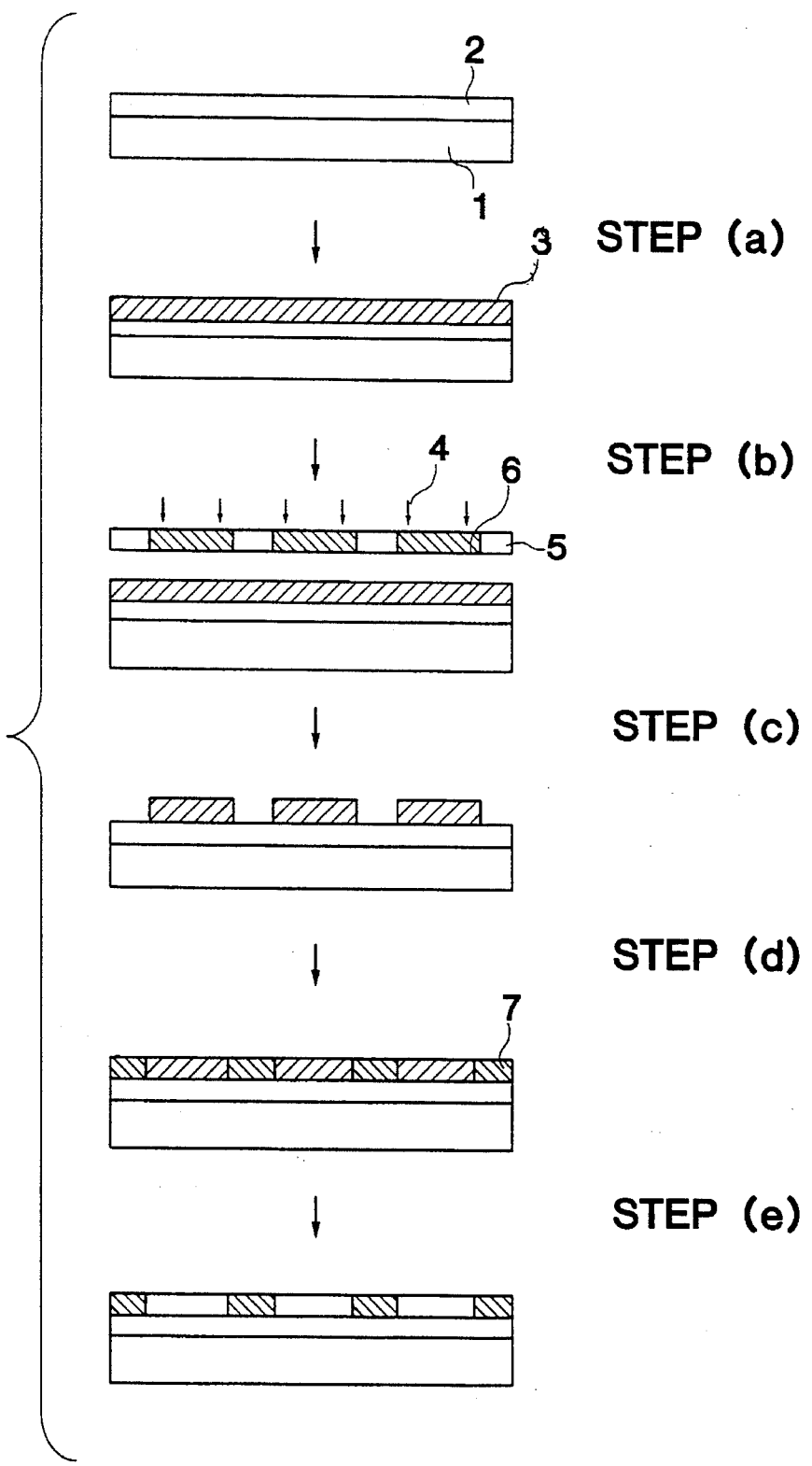

United States Patent [19]

Miyazaki et al.

[11] Patent Number: 5,587,260
[45] Date of Patent: Dec. 24, 1996

[54] METHOD OF FORMING A FUNCTIONAL FILM

[75] Inventors: Susumu Miyazaki, Kitasouma-gun; Tsuyoshi Nakano, Funabashi; Nobuya Niizaki, Yokohama; Junichi Yasukawa, Chigasaki; Miki Matsumura, Tokyo, all of Japan

[73] Assignee: Sumitomo Chemical Company, Limited, Osaka, Japan

[21] Appl. No.: 304,950

[22] Filed: Sep. 13, 1994

[30] Foreign Application Priority Data

Sep. 13, 1993 [JP] Japan .................... 5-227488

[51] Int. Cl.⁶ .................................................. G03F 9/00
[52] U.S. Cl. .................. 430/7; 430/20; 430/293; 430/394
[58] Field of Search ................ 430/7, 324, 293, 430/394, 20

[56] References Cited

U.S. PATENT DOCUMENTS

| | | | |
|---|---|---|---|
| 5,186,801 | 2/1993 | Matsumura et al. | 430/7 |
| 5,214,541 | 5/1993 | Yamasita et al. | 430/7 |
| 5,385,795 | 1/1995 | Yuasa et al. | 430/7 |

FOREIGN PATENT DOCUMENTS 342602  12/1983  Japan .
59114572  10/1992  Japan .

*Primary Examiner*—S. Rosasco
*Attorney, Agent, or Firm*—Birch, Stewart, Kolasch & Birch, LLP

[57] ABSTRACT

There is provided a method of forming a micro-patterned functional film with a high precision on a substrate comprising:

(a) a step of forming a positive or negative-type photoresist film on the entire surface of a substrate having a conductive layer thereon;

(b) an exposure step of irradiating light to the surface of the already formed positive or negative-type photoresist film through overlapped photo-masks having patterns that makes the film cover the substrate except for the predetermined part for forming a functional film in the next developing step;

(c) a developing step of removing the photoresist film of the predetermined part for forming a functional film;

(d) a step of forming a functional film on the substrate in the part where said photoresist film is removed, by electrodeposition with said conductive layer as one electrode; and (e) a step of removing the positive or negative-type photoresist film remaining after the step (c).

Especially a functional film having such lattice-like or stripe-like micro-patterns as being less than about 200 μm in shortest spatial width can be formed.

7 Claims, 2 Drawing Sheets

METHOD OF FORMING A FUNCTIONAL FILM

The present invention relates to a method of forming a functional film micro-patterned such as lattice-like or stripe-like on a substrate. The method is especially useful for the manufacture of a substrate having formed thereon a functional film (black matrix) for the color filter indispensable for assembly of a color liquid crystal display device (LCD). This film is effective for shading of unnecessary light as well as improving other properties.

Hitherto, LCDs using liquid crystal were widely used in the so-called pocket TVs etc. and recently rapid progress has been made for production of larger size devices and screens. Quite a number of such products approaching in image quality to the level of CRT have been commercialized by development of passive matrix adressing using STN liquid crystal instead of TN liquid crystal and active matrix adressing using TFT device. Although various studies have been made for improvement of the image quality and producibility of color display device, some problems still exist in the method of forming a light-shading film called black matrix for prevention of light-leakage and improving image quality (apparent contrast), and the patterns of a black matrix being another problem of significance.

As a method of formation of lattice-like or stripe-like functional film (black matrix) for filling up the portions other than the color image elements of color filter used for making color LCD, there have been known to date printing techniques such as silk screen process and offset process. Also known are methods for forming a thin film such as chromium on the substrate by spattering and then forming black matrix by photolithography. Recently a negative-type photoresist containing a black pigment was developed and a method for formation of black matrix directly by photolithography has been studied. Also known is a method of forming color resin strips on a plurality of parallel conductive circuits by an electrodeposition method, this followed by coating of a negative-type photoresist resin over the entire surface of the substrate, and with said color resin strips as photo-masks, the substrate was exposed to light from backside and the functional film as black matrix was formed in the gap between the color resin strips. (Japanese Patent Unexamined Publication (JP-A) 59-114572 and JP-A-3-42602).

Recently, however, with the LCD of the TFT system which is supposed to be quite hopeful in the future, improvement of the light-shading characteristic of the black matrix film is requested for prevention of the switching element-induced light leakage. Moreover, for improvement of the image quality, it is often the case that the pattern of the black matrix film is required to be still more complicated such as lattice-shaped.

However, by any of the conventional printing methods, such lattice-like pattern of the black matrix film obtainable is limited to be simple, and the inter-lattice space is no less than about 100 μm, and so, a high precision functional film has been thus unattainable. Meanwhile, a method of forming a black matrix by direct photolithography using a negative-type photoresist film containing a black pigment has been studied, but photo-curing of the photoresist film does not proceed sufficiently when the light-shading percentage is higher than a given level, and it is difficult to form a high precision functional film. Another conventional method of exposing the substrate to light from the backside with a color resin strips as a photo-mask exhibits the problem of causing difficulty with regard to the formation of a functional film in a direction crossing the color resin strips, although it has a merit of forming a functional film between the color resin strips with a high precision.

Hence the object of the invention is to solve the above problems of the conventional methods and provide a method of manufacturing a substrate with a micro-patterned lattice-like or stripe-like functional film, for example such as a black matrix film.

The present inventors paid attention to the fact that by the electro-deposition method, it was possible to deposit a film selectively and highly precisely on the conductive layer and it was also possible to accomplish the aforementioned objects by the aid of further contrivances and could thus arrived at the present invention.

That is, the present invention provides a method of forming a functional film micro-patterned on a substrate comprising:

(a) a step of forming a positive or negative-type photoresist film on the entire surface of a substrate having a conductive layer thereon;

(b) an exposure step of irradiating light to the surface of the already formed positive or negative-type photoresist film through overlapped photo-masks having patterns that makes the film cover the substrate except for the predetermined part for forming a functional film in the next developing step;

(c) a developing step of removing the photoresist film from the predetermined part for forming a functional film;

(d) a step of forming a functional film on the substrate in the part where said photoresist film is removed, by electrodeposition with said conductive layer as one electrode; and (e) a step of removing the positive or negative-type photoresist film remaining after the step (c) in the aforementioned order and including a heat-treating step before the step (d).

As the substrate material used in the present invention, a glass plate or transparent plastic plate may be given. The conductive circuit formed on the substrate is made of transparent conductive materials such as ITO film (tin-doped indium oxide film) or "nesa" film (antimony-doped tin oxide film) by hitherto well known methods.

Figure 2A:
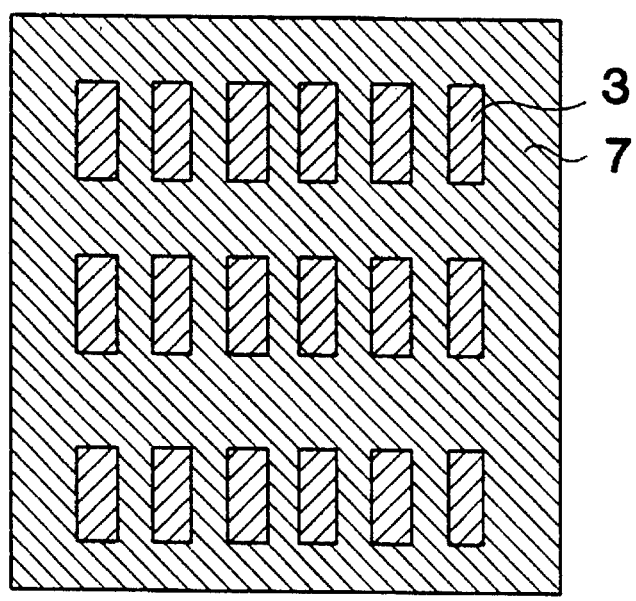
Figure 2B:
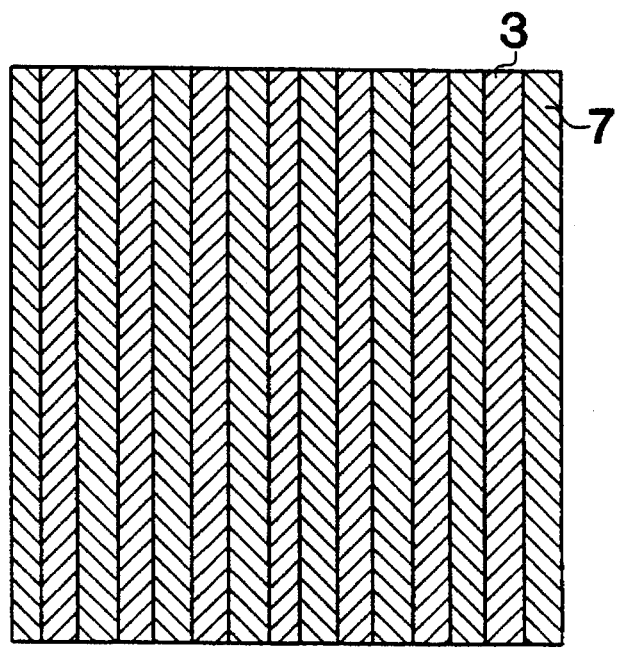

Shown in FIG. 1 are schematic sectional views of the products obtained after the steps (a)–(e). Shown in FIG. 2 (A and B) are schematic plan views showing two alternative patterns of the functional film obtained in the step (d). FIG. 2-A is a schematic view showing a lattice-like one and FIG. 2-B that of a stripe-like one respectively.

In the present invention the shortest spatial width means the width of the photoresist film 3 (which is removed in a later step) shown in FIG. 2-A or 2-B.

The present invention is very effective if the pattern of the functional film is finer, for example, no more than 200 μm in shortest spatial width.

The step (a) of the invented method is a step of forming a negative or positive-type photoresist film on the entire surface of the substrate having a conductive layer thereon.

As examples of positive-type photoresist may be given novolak-type phenol resins containing esterified substances of O-quinonediazid but this means no limitation. As commercial products of the kind available may be given, for example, OFPR-800 (Tokyo Ohka Kogyo, Ltd.: trade name hereinafter the same), PF-7400 (Sumitomo Chemical Co., Ltd.) and FH-2030 (Fuji-Hunt Electronic Technology Co., Ltd.).

As examples of the negative-type photoresist used in the step (a) may be given acrylate resins containing photopolymerization initiators such as benzophenones and antraquinones, but this again means no limitation. As commercial products of the kind available may be given, for example, OMR-83 of Tokyo Ohka Kogyo, Ltd.

As methods of forming positive or negative-type photoresist film are available screen-printing method, offset printing method, roll coating method, bar coating method, spin-coating method, etc.

When the photoresist film is formed by the spin-coating method, it is advisable to adopt 2-step mode of varying the speed of rotation, first 100–200 rpm. for spreading the photoresist on the substrate and then 800–3,000 rpm. in order to make uniform the thickness of the photoresist film. This spin-coating method is useful for forming a film with high precision on the surface of the transparent substrate having a conductive-layer thereon.

The positive or negative-type photoresist film on the surface of the substrate having formed thereon a transparent conductive circuit, is then heat-treated, if necessary, at 60°–100° C. for 5–60 minutes. By this heat-treatment the resin in the positive or negative-type photoresist film is pre-cured, and adhesion between the photoresist film and the transparent substrate is improved.

The exposure step (b) of the invented method is a step of irradiating light through overlapped photo-masks having such patterns to the surface of the already formed positive or negative-type photoresist film so that the photoresist film covers the surface of the substrate except for the predetermined part for formation of the functional film in the next developing step.

For exposure in the step (b), light of a plurality of ranges in wave length may be used according to the kind of positive or negative-type photoresist film but generally preferred is of UV range, and as light source may be used an ultra-high voltage mercury lamp, metal halide lamp or the like. Such a lamp as light source is desired to be of mirror-type and in parallel light mode for precise patterning.

In case of positive-type photoresist film, the exposure of light is normally 10–500 mJ/cm$^2$ depending on the luminous energy of the lamp and the kind of the film used. In the exposed part, the decomposition reaction proceeds to make the film soluble in the undermentioned chemicals.

In case of negative-type photoresist film, the exposure is again normally 10–500 mJ/cm$^2$. In the unexposed part, curing does not proceed and the film comes to be soluble in the undermentioned chemicals.

The step (c) of the invented method is a developing step in which the film is removed in the part where the functional film is to be formed later. In case of the positive-type photoresist film, the exposed part is dissolved and removed. Removal of the part of the film is done by contacting that part with a chemical (developer) having a proper dissolving power. Such chemical may be selected from quite a number of alternatives but usually from alkaline aqueous solutions prepared by dissolving caustic soda, sodium carbonate, quaternary ammonium salts and organic amines etc. in water or organic solvents such as esters, ketones, alcohols, aromatic hydrocarbons and chlorinated hydrocarbons. Removal of the film may be done by either dipping or showering, the time required being 5 seconds–3 minutes or so. Thereafter the remaining film is to be thoroughly washed off with water or pure water and then for improving adhesion and facilitating removal of remaining film in the step (e) later, heat treatment is to be done at 80°–280° C. for 5–60 minutes, if necessary.

In case of the negative-type photoresist film, the unexposed part of the film comes to be uncured and removable. The removing method is same as that for the aforementioned positive-type photoresist film.

In this step, a negative or positive-type of photoresist film is formed according to the photo-mask's pattern for the functional film. Examples of the photo-mask's pattern are shown in A and B in FIG. 2 in which alternative patterns are indicated by reference numeral 7.

The step (d) of the invented method is a step for forming a functional film by electrodeposition on the transparent substrate, with the conductive layer thereon as one electrode. The method for this kind of electrodeposition on a conductive layer is generally well known.

For example, the electrodeposition method is described in JP-A-4-64875, and Practical Surface (Treatment) Technology Vol. 34, No. 6 (1987), p. 57–63. As electrodeposition method there are two alternatives, anionic type and cationic type. Although both of these alternatives are available, preferred is the anion type electro-deposition method for safety from affecting the circuit and the ease for selection of appropriate resin for binder from many varieties. As the binder (resin material) in electrodeposition fluid for the electro-deposition are used those of acryl type, polyester type, polybutadiene type, polyolefin type etc. These may be used alone or in combination. To such binder is to be added black pigment and other materials for imparting functionality.

The electrodeposition fluid is generally prepared by dispersing and diluting the binder etc. in water. Besides as aqueous dispersion or solution it may as well be prepared as non-aqueous fluid by use of some organic solvent. First a transparent substrate treated in the aforementioned steps is dipped thereinto a bath of electrodeposition fluid. In case of anion electrodeposition, using the conductive circuit as the positive electrode and a non-corrosive electroconductive material (e.g. stainless steel) as the counter electrode, a DC voltage is applied, and then electric current flows from the positive electrode to the counter electrode, this resulting in formation of electrodeposition film in the window on the conductive circuit. The electrodeposition condition is normally at 10–300 V for 1 seconds–3 minutes or so. After formation of the electrodeposited film, the film is thoroughly washed for removal of foreign matters. For enhancing the film strength, a heat treatment may be carried out, if necessary, under conditions of at 100°–280° C. for 10–20 minutes.

In case of forming black matrix for LCD etc., black film is formed by the electrodeposition method in the predetermined part not covered with the resist film.

The step (e) of the invented method is for removing (peeling-off) the positive or negative-type photoresist film only. Removal of the film is done only when a chemical of a sufficiently high dissolving power is used, that is, when the film to be removed is brought into contact with the so-called developer. Such chemical may be selected from quite a number of alternatives but usually from alkaline aqueous or non-aqueous solutions prepared by dissolving caustic soda, sodium carbonate, quaternary ammonium salts and organic amines etc. in water or in organic solvents such as esters, ketones, alcohols, ethers, and chlorinated hydrocarbons. Removal of the film may be done by either dipping or showering, the time required being 30 seconds–20 minutes or so. Brushing or rubbing with woven fabric may as well be effective. After this step electrodeposited film remains and functional film like black matrix is formed. Organic solvents, water or the like is used for thorough washing and, if necessary, post-baking may be done, if necessary, for satisfying the required performance.

In case any color filter for LCDs is to be formed, first the black matrix film is formed on the transparent substrate and then the trichromatic coats (red, green and yellow) are formed in the gap (windows part) between black matrix film in a given orientation. Thereafter, an overcoat film (protective film) is formed thereon. As the overcoat material resins such as of epoxy, polyimide and acrylate type are used. Formation of the overcoat film is done by first using spin coater or roll coater and then by thermosetting the resulting film. Then, further thereon a transparent conductive layer is formed as the electrode for driving the liquid crystal and also a circuit pattern is formed, if necessary, and a color filter is thus completed.

Now the details of the present invention will be explained with reference to the following embodiment.

Embodiment (1) Formation of positive-type photoresist film

A mixture of 20 parts by weight of acetic acid ethyl Cellosolve and 100 parts by weight of positive photoresist film FH2030 (Fuji-Hunt Electronics Technology Co., Ltd.) was prepared and coated on the entire surface of a transparent substrate in two-step mode of spin-coating 200 rpm/5 seconds and 1,000 rpm/20 seconds, this followed by heat treatment at 90° C. for 30 minutes, and thus a positive-type photoresist film of 5 μm in thickness was formed [=step (a)].

(2) Exposure

A lattice-like patterned photo-mask (opening: 60 μm×200 μm) was set on a positive-type photoresist film (gap: 30 μm) and exposure was done by the use of a proximity exposure machine (Dainippon Kaken: MAP-1200) under conditions of 100 mJ/cm$^2$ [=step (b)].

(3) Development

After exposure the exposed substrate was dipped in a developer at 25° C. for 60 seconds, SOPD (Sumitomo Chemical Co., Ltd.) for removal of the exposed part of the photoresist film thereon, followed by pure water rinsing and air blow drying, and a positive-type photoresist film was thus formed on the lattice-like window portions [=step (c)].

(4) Formation of black matrix film

For electrodeposition coating an aqueous solution of anionic polyester resin (Sinto Chemitron Co., Ltd.: Sintoron F-Black) with black inorganic pigment (carbon) dispersed therein was used and electrodeposition was carried out at 50 V for 20 seconds, for black electrodeposited film to be formed on the transparent substrate around the lattice-like window portions, this followed by thorough rinsing and heat treatment at 260° C. for one hour [=step (d)].

(5) Removing of positive-type photoresist film

The positive-type photoresist film at the lattice-like window (on the substrate) was dipped in a 5% by weight aqueous solution of caustic soda at 40° C. for 15 minutes, and then peeling of the positive-type photoresist film only was done by brushing under pure water showering. Then after thorough washing and air-blow drying, heating was done at 200° C. for 30 minutes [=step (e)].

This resulted in formation of a black matrix film (thickness: 1.2 μm) at frame portions of lattice on a transparent substrate having a conductive layer thereon. When this functional film was examined using an optical microscope (Nikon, Ltd.: OPTIPHOT-88) at a magnification ratio of 1:200, the black matrix film on the frame portions was formed with a high precision.

According to the present invention, there is provided a method of forming a micro-patterned functional film with a high precision on a substrate. Especially a functional film having such micro-patterns as being less than about 200 μm in shortest spatial width (=width of each window) can be formed.

Hence, for example, when a black matrix film is formed and then a colored film is formed on the windows portion according to the present invention, a color filter featuring effective prevention of light leakage, high brightness of the colored portions and excellent optical properties is obtainable. The present invention is particularly suited for preparation of a color filter as an essential part of matrix-type color display device together with TFT.

What is claimed is:

1. A method of forming a functional film micropatterned on a substrate comprising:

(a) a step of forming a positive or negative-type photoresist film on the entire surface of a substance having a conductive layer thereon;

(b) an exposure step of irradiating light to the surface of the already formed positive or negative-type photoresist film through overlapped photo-masks having patterns that allow the film to cover the substrate except for a predetermined portion for forming a functional film in the next developing step;

(c) a developing step of removing the photoresist film from the predetermined portion for forming a functional film;

(d) a step of forming a functional film on the substrate in the portion where said photoresist film is removed, by electrodeposition with said conductive layer as one electrode; and (e) a step of removing the positive or negative-type photoresist film remaining after the step (c);

wherein a step of heat-treating the films remaining after the developing step (c) at 80°–280° C. for 5–60 minutes is included before the step (d).

2. A method according to claim 1, wherein the pattern of the functional film is lattice-like or stripe-like and the shortest spatial width of said functional film is less than about 200 μm.

3. A color filter comprising a substrate having a micro-patterned functional film as black matrix obtained by the method according to claim 2.

4. A color filter formed by disposing trichromatic films on a substrate having a micro-patterned functional film as black matrix obtained by the method according to claim 2, which further comprises an overcoat film formed thereon and a transparent conductive film for driving a liquid crystal formed thereon.

5. A color filter comprising a substrate having a micro-patterned functional film as black matrix obtained by the method according to claim 1.

6. A color filter formed by disposing trichromatic films on a substrate having a micro-patterned functional film as black matrix obtained by the method according to claim 1, which further comprises an overcoat film formed thereon and a transparent conductive film for driving a liquid crystal formed thereon.

7. A method according to claim 1, wherein said functional film comprises a binder and black pigment to impart functionality.

* * * * *